United States Patent
Lee

(10) Patent No.: US 7,180,747 B2
(45) Date of Patent: Feb. 20, 2007

(54) HEAT DISSIPATION DEVICE FOR A COMPUTER MOTHER BOARD

(76) Inventor: Cheng-Ping Lee, P.O. Box No. 6-57, Junghe, Taipei 235 (TW)

( * ) Notice: Subject to any disclaimer, the term of this patent is extended or adjusted under 35 U.S.C. 154(b) by 0 days.

(21) Appl. No.: 11/139,561

(22) Filed: May 31, 2005

(65) Prior Publication Data

US 2006/0268508 A1    Nov. 30, 2006

(51) Int. Cl.
*H05K 7/20* (2006.01)
*H05K 5/00* (2006.01)
*H01L 23/34* (2006.01)

(52) U.S. Cl. ............... 361/720; 361/687; 361/707; 361/710; 257/713

(58) Field of Classification Search ............. 361/687, 361/707, 709, 831, 720
See application file for complete search history.

(56) References Cited

U.S. PATENT DOCUMENTS 6,249,428 B1 *  6/2001  Jeffries et al. .............. 361/684
6,320,776 B1 *  11/2001 Kajiura et al. .............. 363/141
6,504,719 B2 *  1/2003  Konstad et al. ............. 361/698
6,542,362 B2 *  4/2003  Lajara et al. ............... 361/687

\* cited by examiner

*Primary Examiner*—Lisa Lea-Edmonds
*Assistant Examiner*—Zachary Pape
(74) *Attorney, Agent, or Firm*—Troxell Law Office PLLC

(57) ABSTRACT

A heat dissipation device for a computer mother board includes a computer enclosure, a heat sink and a mother board. The computer enclosure includes a frame, front and rear panels, two side panels and top and bottom panels respectively connecting to the frame. One side panel is disposed with a support board at the inner side thereof. The heat sink is fixed to one surface of the support board and between the support board and the side panel. The mother board is connected to the other surface of the support board. A plurality of connectors and electronic modules are disposed at one side of the mother board and heat generation modules including a CPU and an electronic chip are disposed at the other side of the mother board. The heat generation modules are in thermal contact with the heat sink.

3 Claims, 5 Drawing Sheets

HEAT DISSIPATION DEVICE FOR A COMPUTER MOTHER BOARD

BACKGROUND OF THE INVENTION (a) Field of the Invention

The present invention relates to a heat dissipation device for a computer mother board and particularly to a heat dissipation device for reducing noise and increasing area of heat dissipation.

(b) Description of the Prior Art

As the development of computer information technology, equipment and components related to a computer are changed quickly, such as a hard disk, a mother board, and a central processing unit (CPU). Multimedia data processed through Boolean calculation are growing and the corresponding processing speed is increasing which may result in overhigh operation temperature of the equipment and IC modules in the computer. Even a chip on a mother board generates high heat in operation. Therefore, when the generated heat is not dissipated in time, the normal operation will be adversely affected, which may result in decrease of operation speed or life expectancy. A common solution is to dispose a heat sink and a fan corresponding to a heat source.

A conventional heat dissipation device for a CPU mounted on a mother board includes a fin group attached to the CPU, and a fan attached to the fin group. So the fin group absorbs heat produced by the CPU and the fan blows to the fin group thereby dissipating the heat absorbed by the fin group.

Other components also produce heat besides the CPU on the mother board when in operation. However, since the interior of a computer enclosure is close, the heated air cannot be directly exhausted from the interior to the exterior of the computer enclosure. So the heated air is circulated within the computer enclosure. That's, the dissipation manner of a fan blowing a fin group makes the heated air recirculated in the close space within the computer enclosure. Therefore the conventional heat dissipation is poor, which results in low operation efficiency of the CPU even system crash due to overhigh temperature. Furthermore, the operation of the fan causes noise. Thus, it is desired to improve the conventional heat dissipation device for a computer mother board.

SUMMARY OF THE INVENTION

Accordingly, an object of the present invention is to provide a heat dissipation device for a computer mother board which dissipates heat generated from heat generation modules through a heat sink to a computer enclosure thereby increasing area of heat dissipation and reducing noise.

To achieve the above object, a heat dissipation device for a computer mother board in accordance with the present invention includes a computer enclosure, a heat sink and a mother board. The computer enclosure includes a frame, front and rear panels, two side panels, and top and bottom panels respectively connecting to the frame. One side panel is disposed with a support board at the inner side thereof. The heat sink is fixed to one surface of the support board and between the support board and the side panel. The mother board is connected to the other surface of the support board. A plurality of connectors and electronic modules are disposed at one side of the mother board and heat generation modules including a CPU and an electronic chip are disposed at the other side of the mother board. The heat generation modules are in thermal contact with the heat sink.

Other objects, advantages and novel features of the present invention will be drawn from the following detailed embodiment of the present invention with attached drawings, in which:

DESCRIPTION OF THE PREFERRED EMBODIMENT

Figure 1:
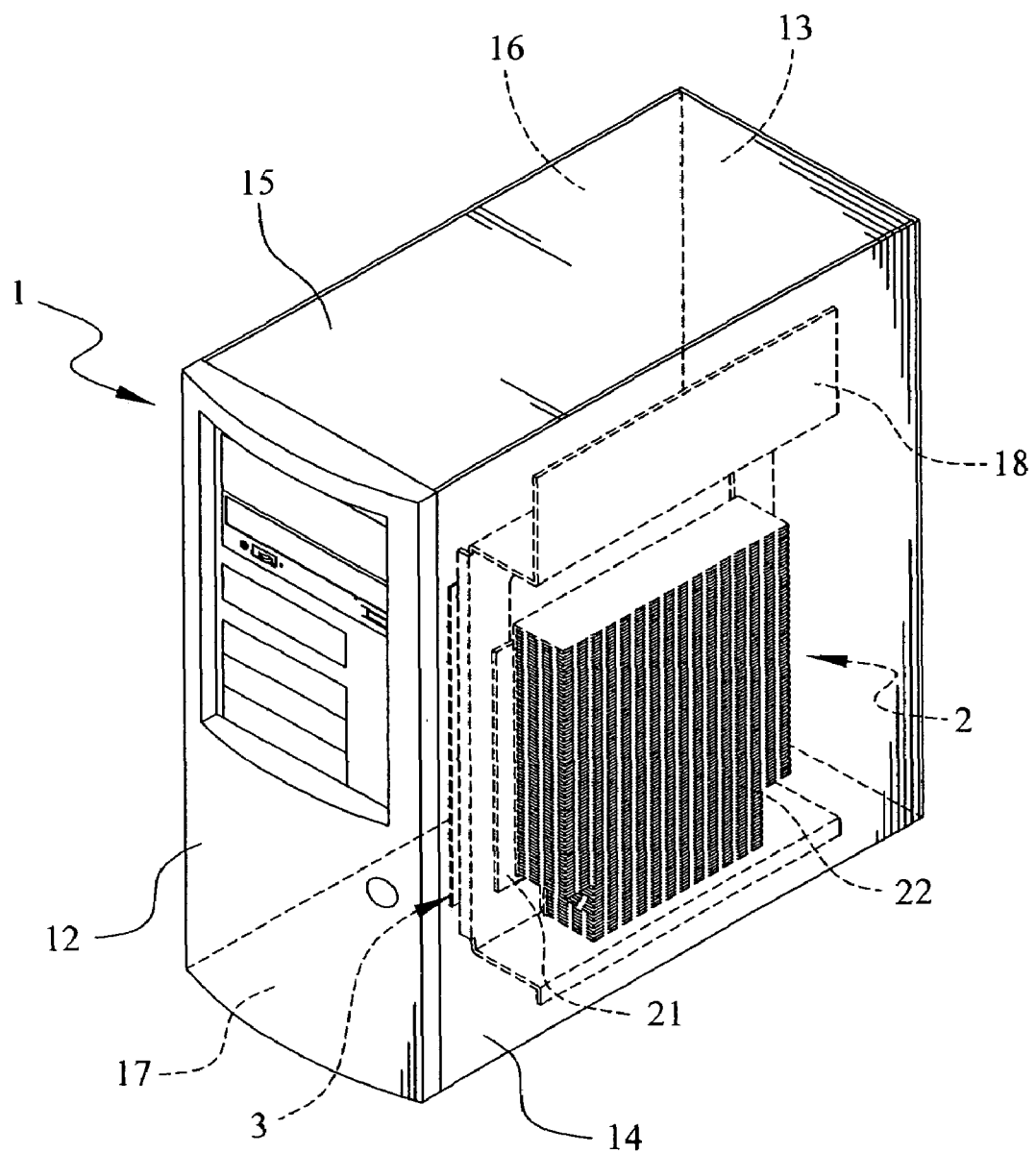
FIG. 1 is a perspective view of a heat dissipation device of the present invention.
Figure 2:
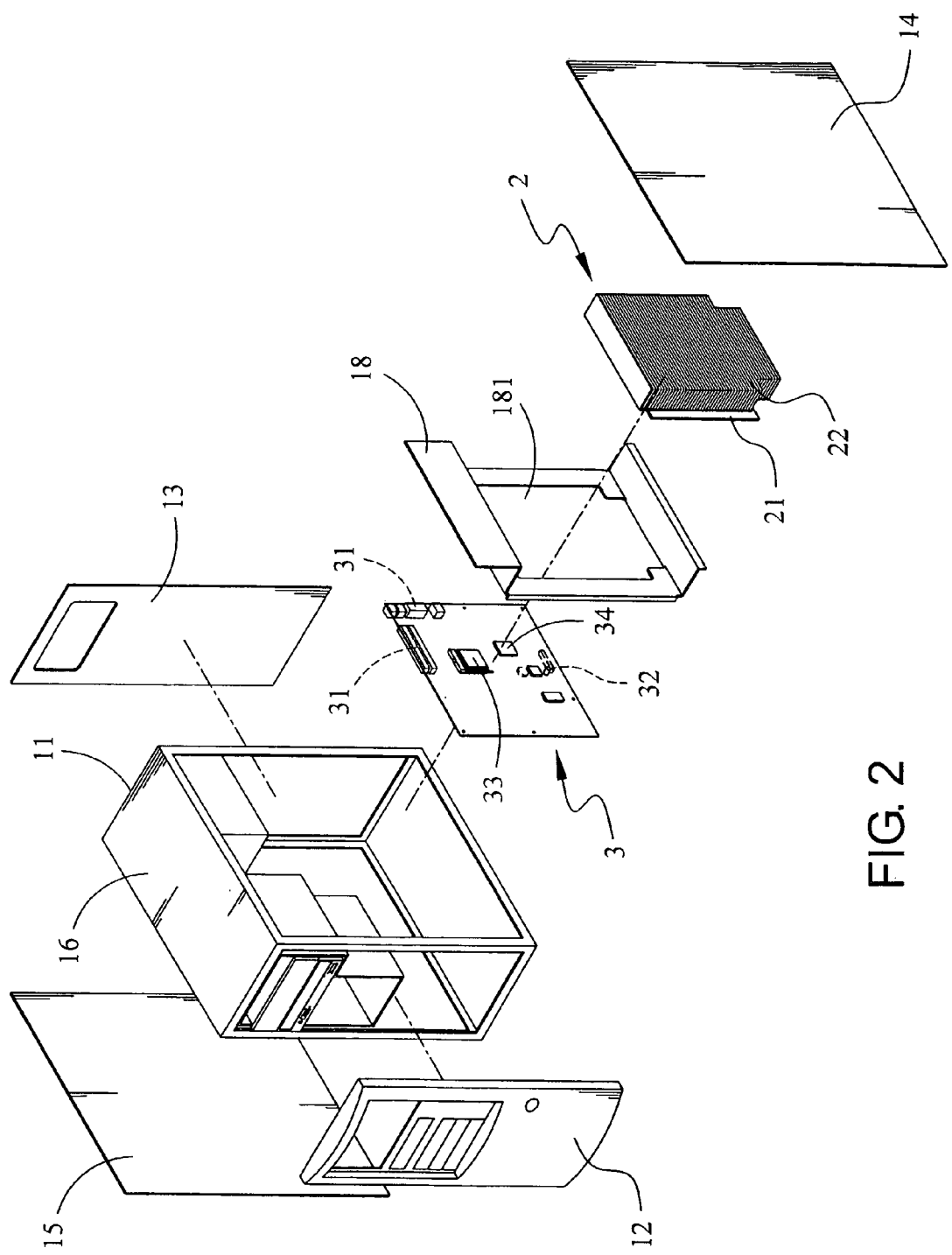
FIG. 2 is an exploded view of FIG. 1
Figure 3:
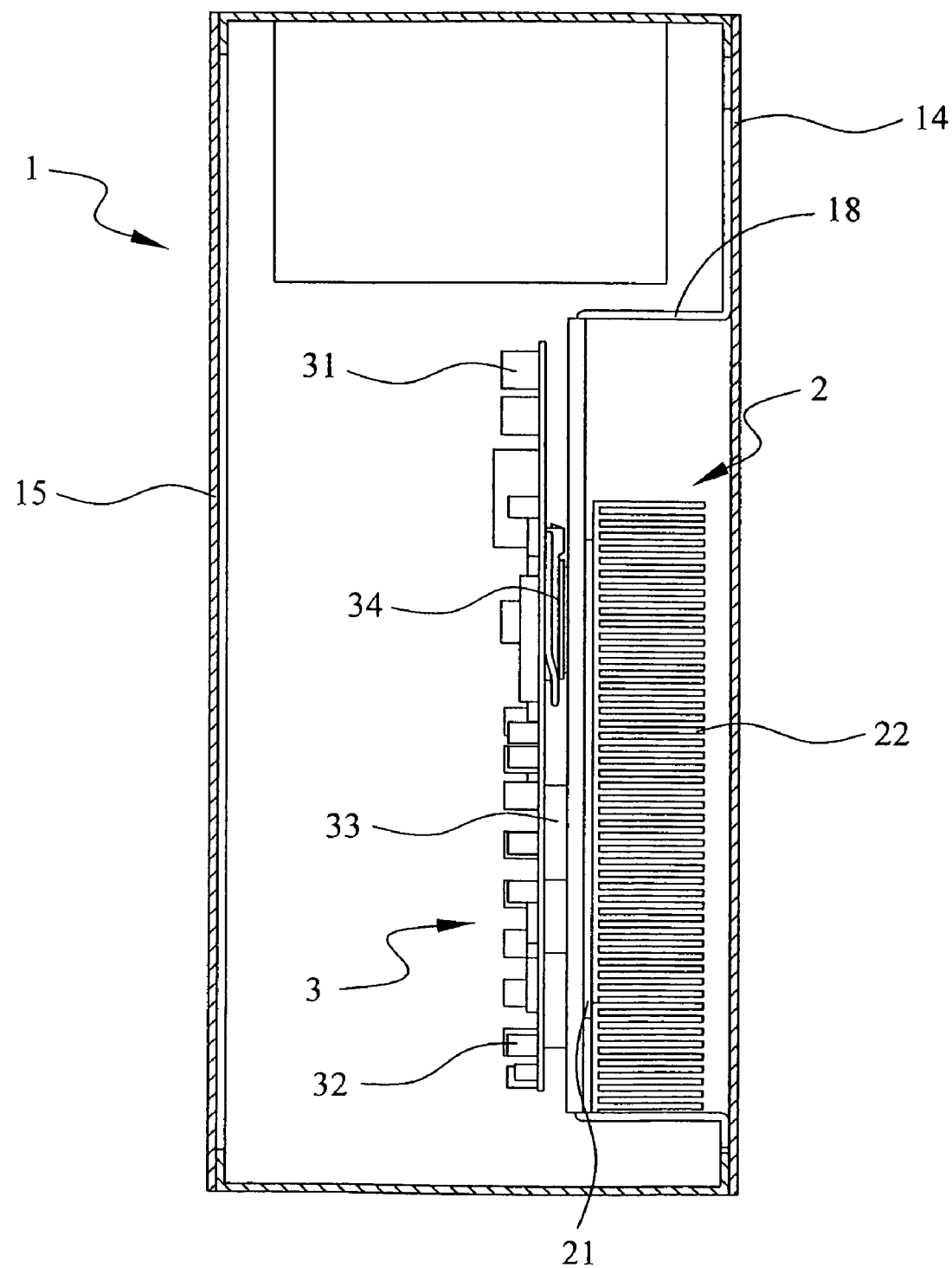
FIG. 3 is a cross-sectional view of FIG. 1.

Referring to FIGS. 1–3, a heat dissipation device for a computer mother board of the present invention includes a computer enclosure 1, a heat sink 2 and a mother board 3 for reducing noise and increasing area of heat dissipation.

The computer enclosure 1 includes a frame 11, front and rear panels 12, 13, two side panels 14, 15 and top and bottom panels 16, 17 respectively connecting with the frame 11. The side panel 14 is disposed with a support board 18 in the inner side thereof. A through hole 181 is defined in the support board.

The heat sink 2 is disposed between the support board 18 and the side panel 14 and includes a base 21 and a plurality of fins 22 extending from the base 21. The base 21 is fixed at one surface of the support board 18 corresponding to the through hole 181.

The mother board 3 is disposed at the other surface of the support board 18. A plurality of connectors 31 and electronic modules 32 are disposed at one side of the mother board 3. The mother board 3 is disposed with heat generation modules including a CPU 33, an electronic chip 34 and so on at the other side thereof. The heat generation modules are in thermal contact with the heat sink 2. Thus, the above structures form the heat dissipation device for the mother board of the present invention.

Figure 4:
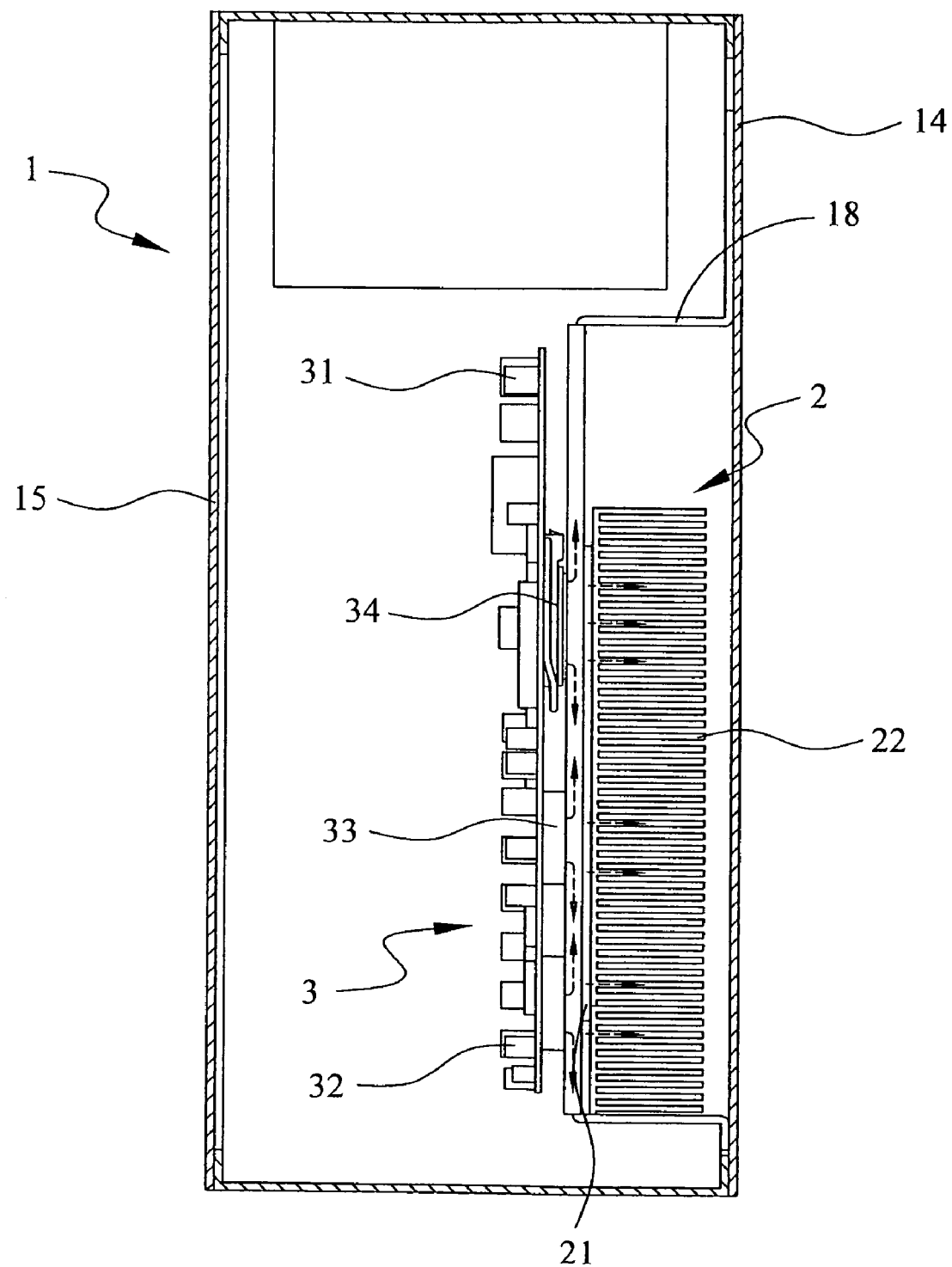
FIG. 4 is similar to FIG. 3 showing one operation status.
Figure 5:
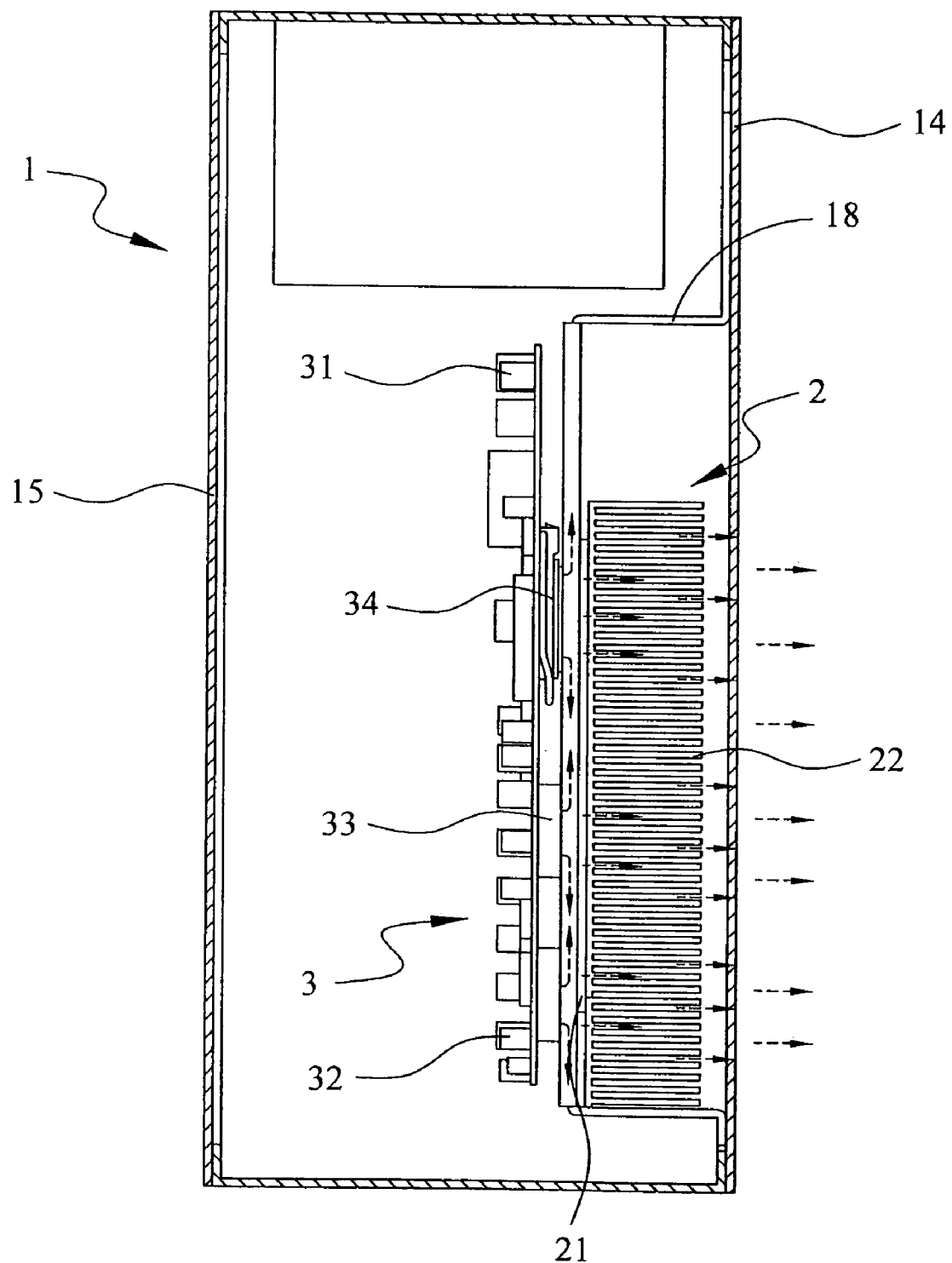
FIG. 5 is similar to FIG. 3 showing another operation status.

Referring to FIGS. 4 and 5, when the heat generation modules 33, 34 generate heat in operation, the base 21 of the heat sink 2 directly absorbs the heat from the heat generation modules 33, 34 and then conducts the heat to the fins 22 thereby dissipating the heat.

Since the volume of the heat sink 2 is slightly larger than the support board 18, the fins 22 can absorb a relatively large amount of heat from the heat generation modules. When the heat is dissipated from the fins 22 and the fins 22 directly contact the side panel 14 (as shown in FIG. 5), the fins 22 conduct the heat to the side panel 14 of the computer enclosure 1 for heat dissipation. Or when the heat is dissipated from the fins 22 and the fins 22 donot contact the side panel 14 thereby defining a gap between the fins 22 and the side panel 14 (as shown in FIG. 4), an airflow channel is defined in the gap for dissipating the heat at the fins 22.

As mentioned above, the heat dissipation device for the computer mother board can effectively dissipate the heat generated from the heat generation modules through the heat sink 2 to the computer enclosure 3 thereby increasing area of heat dissipation and saving assembling space of the mother board for facilitating the assembly of the mother board.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A heat dissipation device for a computer comprising:
   a) a computer enclosure having:
      i) a frame;
      ii) front and rear panels, two side panels, and top and bottom panels connected to the frame; and
      iii) a support board connected to a first side panel of the two side panels, the support board having a first board surface and a second board surface located on opposing sides thereof;
   b) a heat sink fixed to the first board surface of the support board and located between the support board and the first side panel; and
   c) a mother board connected to the second board surface of the support board and having:
      i) a plurality of connectors and electronic modules connected to a first side thereof; and
      ii) a plurality of heat generating modules including a central processing unit and an electronic chip located on a second side thereof, the heat sink is in thermal contact with the plurality of heat generating modules, wherein the support board has a through hole, the heat sink aligning with each of the plurality of heat generating modules through the through hole.

2. The heat dissipation device according to claim 1, wherein the heat sink includes a base and a plurality of fins extending outwardly from the base.

3. The heat dissipation device according to claim 1, wherein the heat sink is spaced apart from the bottom panel of the computer enclosure.

* * * * *